United States Patent
Lee

(10) Patent No.: US 8,958,118 B2
(45) Date of Patent: *Feb. 17, 2015

(54) METHOD AND APPARATUS FOR ADJUSTING SIZE OF OBJECT INCLUDED IN PRINTING TARGET TO BE PRINTED AT PREDETERMINED REDUCTION RATIO

(75) Inventor: Sung-myun Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 12 days.

This patent is subject to a terminal disclaimer.

(21) Appl. No.: 13/483,320

(22) Filed: May 30, 2012

(65) Prior Publication Data

US 2012/0236326 A1    Sep. 20, 2012

Related U.S. Application Data

(63) Continuation of application No. 12/038,958, filed on Feb. 28, 2008, now Pat. No. 8,208,168.

(30) Foreign Application Priority Data

Jun. 26, 2007  (KR) .................................. 2007-63136

(51) Int. Cl.
| | | |
|---|---|---|
| G06K 15/02 | (2006.01) | |
| H04N 1/393 | (2006.01) | |
| H01L 21/67 | (2006.01) | |
| H01L 21/687 | (2006.01) | |

(52) U.S. Cl.
CPC .... *H01L 21/67051* (2013.01); *H01L 21/67046* (2013.01); *H01L 21/68728* (2013.01)
USPC ............................... 358/1.2; 358/1.9; 358/451

(58) Field of Classification Search
None
See application file for complete search history.

(56) References Cited

U.S. PATENT DOCUMENTS 5,613,017 A * 3/1997 Rao et al. ...................... 382/174
5,825,942 A * 10/1998 Miyaza ......................... 382/298

(Continued)

FOREIGN PATENT DOCUMENTS

| JP | 2006-309706 | 11/2006 |
|---|---|---|
| KR | 10-2006-0134667 | 12/2006 |

OTHER PUBLICATIONS

Office Action mailed Aug. 30, 2011, issued in corresponding U.S. Appl. No. 12/038,958.

(Continued)

*Primary Examiner* — Scott A Rogers
(74) *Attorney, Agent, or Firm* — Staas & Halsey LLP

(57) ABSTRACT

A method and apparatus for adjusting the size of an object included in a printing target to be printed according to a reduction ratio, the method including calculating at least one dimensional value of the object after the size of the object has been converted according to a reduction ratio, by the way of the at least one processor; and changing the at least one dimensional value to a predetermined value, when the calculated the at least one dimensional value is equal to or less than a reference dimensional value, by the way of the at least one processor.

20 Claims, 5 Drawing Sheets

(56) References Cited

U.S. PATENT DOCUMENTS

| | | | |
|---|---|---|---|
| 5,896,470 A * | 4/1999 | Miyaza | 382/298 |
| 7,352,898 B2 * | 4/2008 | Kitagawara et al. | 382/173 |
| 7,410,311 B2 | 8/2008 | Suzuki et al. | |
| 7,711,208 B2 * | 5/2010 | Grunder | 382/298 |
| 7,885,484 B2 * | 2/2011 | Hasegawa et al. | 382/298 |
| 7,978,935 B2 * | 7/2011 | Grunder | 382/298 |
| 8,164,762 B2 * | 4/2012 | Rizzo | 358/1.11 |
| 8,462,362 B2 * | 6/2013 | Sakurai | 358/1.13 |
| 2006/0291748 A1 | 12/2006 | Lee | 382/298 |
| 2009/0003914 A1 * | 1/2009 | Lee | 400/76 |
| 2010/0111419 A1 * | 5/2010 | Uehori | 382/182 |
| 2012/0044507 A1 * | 2/2012 | Jo et al. | 358/1.2 |

OTHER PUBLICATIONS

Notice Allowance mailed Feb. 29, 2012, issued in corresponding U.S. Appl. No. 12/038,958.

U.S. Appl. No. 12/038,958, filed Feb. 28, 2008, Sung-Myun Lee, Samsung Electronics Co, Ltd.

Korean Notice of Allowance issued Nov. 22, 2013 in Korean Patent Application No. 10-2007-0063136.

* cited by examiner

METHOD AND APPARATUS FOR ADJUSTING SIZE OF OBJECT INCLUDED IN PRINTING TARGET TO BE PRINTED AT PREDETERMINED REDUCTION RATIO

CROSS-REFERENCE TO RELATED APPLICATIONS

This application is a continuation of U.S. application Ser. No. 12/038,958, filed on Feb. 28, 2008, now U.S. Pat. No. 8,208,168 which claims the benefit of Korean Application No. 2007-63136, filed on Jun. 26, 2007 in the Korean Intellectual Property Office, the disclosures of which is incorporated herein in their entirety by reference.

BACKGROUND

1. Field

Aspects of the present disclosure relate to a method and an apparatus for adjusting the size of an object included in a printing target to be printed at a predetermined reduction ratio.

2. Description of the Related Art

In the case where reduction printing is performed with an image forming apparatus (such as a printer) that performs a printing function, a user adjusts the size of a printing target according to a desired reduction ratio via a printer driver, thereby performing the reduction printing. In this manner, in order to print a printing target at a reduced size, when the size of the printing target is adjusted according to a predetermined reduction ratio, sizes of objects included in the printing target are also adjusted according to the predetermined reduction ratio. Here, the object is a component of the printing target such as a font, an image, and a vector graphic. In a calculation process in which an object size is adjusted according to a predetermined reduction ratio, an object width or an object height may become 0 since an integer calculation by a computer does not consider decimal point values less than 1. In the case where the object width or the object height becomes 0, the object does not appear on a print medium. Accordingly, when the object does not appear on the print medium, it is difficult to read contents of the print medium, thereby causing printing quality deterioration.

SUMMARY

Aspects of the present disclosure provide a method of adjusting a size of an object included in a printing target to be printed according to a reduction ratio such that a phenomenon in which the object does not appear on printed matter is prevented.

Aspects of the present disclosure also provide a computer-readable recording medium having recorded thereon a program for executing the method on a computer.

According to an aspect of the present disclosure, there is provided a method of adjusting a size of an object included in a printing target to be printed according to a reduction ratio, the method including: calculating at least one of a width and a height of the object after the object has been converted according to the reduction ratio; and changing the width and/or the height of the object to a predetermined value and setting the changed value, when the calculated width and/or the calculated height of the object is 0.

According to another aspect of the present disclosure, there is provided a computer readable recording medium having recorded thereon a program for executing a method of adjusting a size of an object included in a printing target to be printed according to a reduction ratio on a computer.

According to another aspect of the present disclosure, there is provided a method of adjusting a size of an object included in a printing target to be printed according to a reduction ratio, the method including: extracting converted coordinate values of the object; and changing the extracted coordinate values and setting the changed values, when the extracted left horizontal coordinate value and the extracted right horizontal coordinate value are equal, and/or when the extracted top vertical coordinate value and/or the extracted bottom vertical coordinate value are equal.

According to another aspect of the present disclosure, there is provided an apparatus for adjusting a size of an object included in a printing target to be printed according to a reduction ratio, the apparatus including an object calculation unit to calculate a width and/or a height of the object; and an object setting unit to change the width and/or the height of the object to a predetermined value and setting the changed value, when the calculated width and/or the calculated height of the object is 0.

According to yet another aspect of the present disclosure, there is provided an apparatus for adjusting a size of an object included in a printing target to be printed according to a reduction ratio, the apparatus including: an object calculation unit to extract converted coordinate values of the object after the object has been converted according to the reduction ratio; and an object setting unit to change one or more of the extracted coordinate values and to set the changed values when an extracted left horizontal coordinate value is equal to an extracted right horizontal coordinate value, and/or when an extracted top vertical coordinate value is equal to an extracted bottom vertical coordinate value.

Additional aspects and/or advantages of the disclosure will be set forth in part in the description which follows and, in part, will be obvious from the description, or may be learned by practice of the disclosure.

BRIEF DESCRIPTION OF THE DRAWINGS

These and/or other aspects and advantages of the disclosure will become apparent and more readily appreciated from the following description of the embodiments, taken in conjunction with the accompanying drawings of which.

DETAILED DESCRIPTION OF THE EMBODIMENTS

Figure 1:
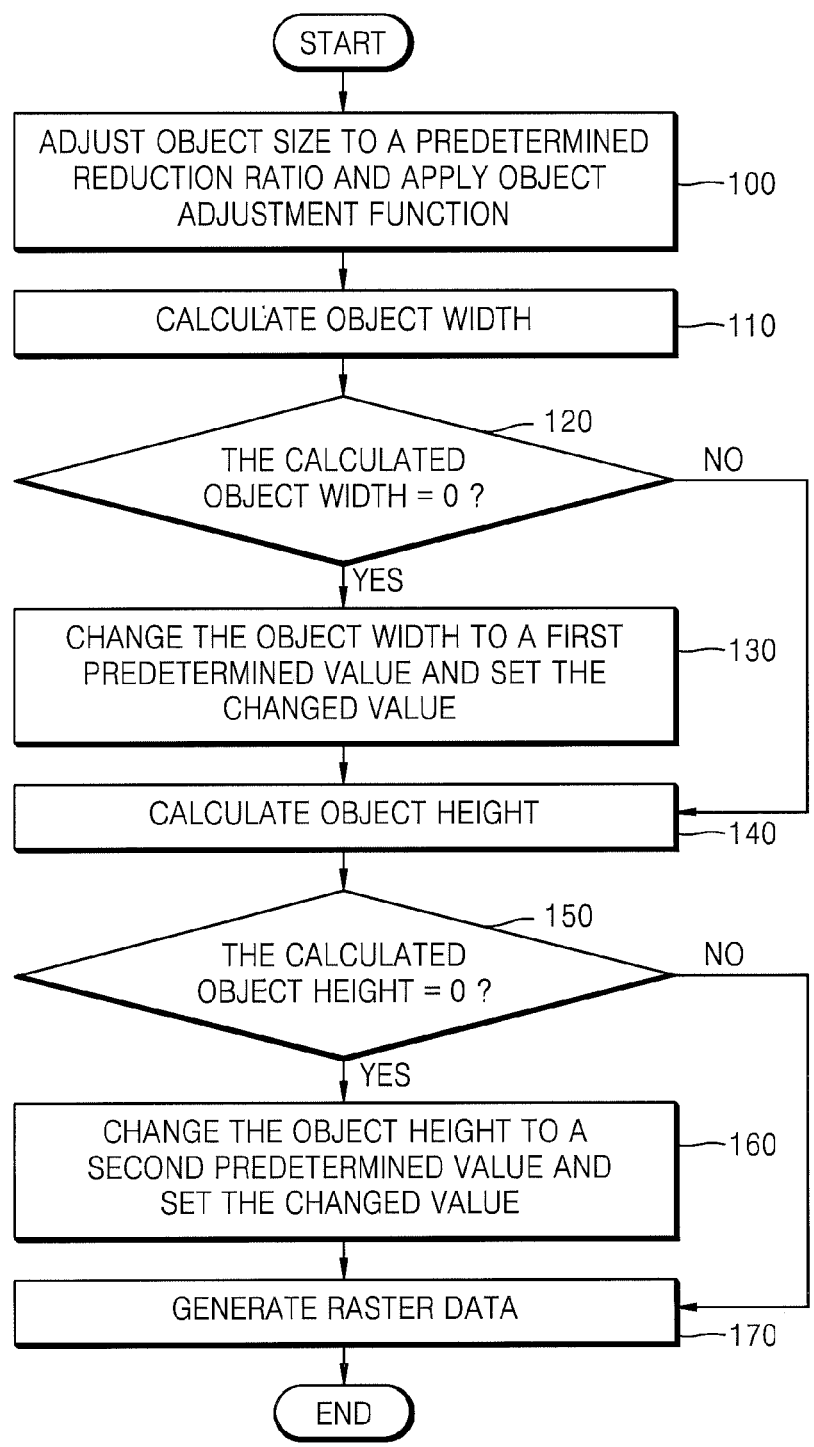
FIG. 1 is a flowchart illustrating a method of adjusting a size of an object included in a printing target to be printed based on a reduction ratio according to an embodiment of the present disclosure.

Reference will now be made in detail to the present embodiments of the present disclosure, examples of which are illustrated in the accompanying drawings, wherein like reference numerals refer to the like elements throughout. The embodiments are described below in order to explain the present disclosure by referring to the figures.

FIG. 1 is a flowchart illustrating a method of adjusting a size of an object included in a printing target to be printed based on a reduction ratio according to an embodiment of the present disclosure. Referring to FIG. 1, the size of an object to be printed is adjusted according to a reduction ratio, and an object adjustment function is applied in operation 100. Specifically, a user interface may be used to set a desired reduction ratio and adjust the sizes of the objects included in the printing target according to the desired reduction ratio. Furthermore, the user interface may be used to activate an adjustment function so that the object adjustment function operates according to an embodiment of the present disclosure. However, it is understood that according to other aspects, the reduction ratio is not set through a user interface. For example, the reduction ratio may be predetermined or may be automatically set according to a print medium size.

Figure 2:
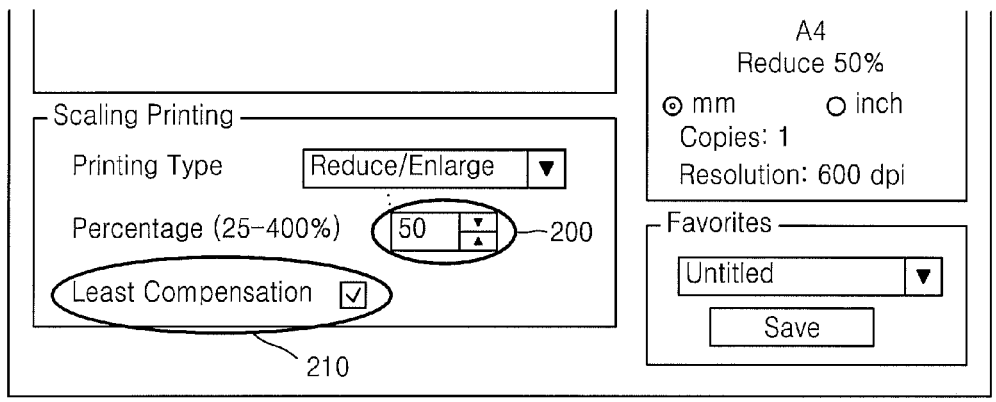
FIG. 2 is a diagram illustrating a user interface for setting the reduction ratio according to an embodiment of the present disclosure.

FIG. 2 is a diagram illustrating the user interface for setting the reduction ratio according to an embodiment of the present disclosure. Referring to FIG. 2, in order to adjust the size of an object included in the printing target to be printed at the reduction ratio according to an embodiment of the present disclosure, a desired reduction ratio 200 is set by the user interface illustrated in FIG. 2. Similarly, a function of least adjustment 210 is selected, thereby enabling the object adjustment function to be operated according to the set reduction ratio.

Figure 3A:
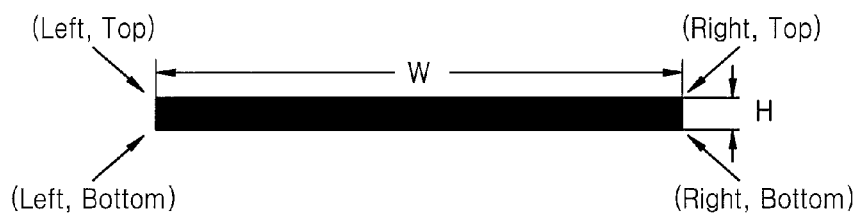
FIG. 3A is a diagram illustrating coordinate values for indicating a rectangle-shaped object that is not reduced.
Figure 3B:
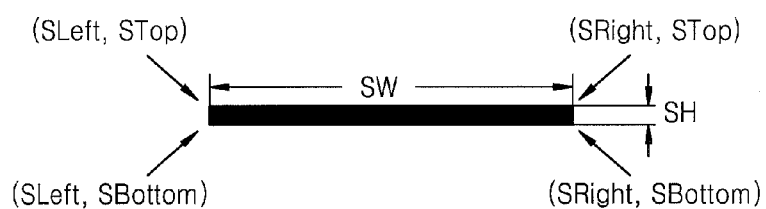
FIG. 3B is a diagram illustrating coordinate values for indicating a rectangle-shaped object whose size is adjusted based on a reduction ratio according to an embodiment of the present disclosure.

Referring back to FIG. 1, after the object size is adjusted and the object adjustment function is applied (operation 100), a width of the object is calculated in operation 110. Referring to FIGS. 3A and 3B, a calculating of the object width will now be described in detail. FIG. 3A is a diagram illustrating coordinate values for indicating a rectangle-shaped object that is not reduced, and FIG. 3B is a diagram illustrating coordinate values for indicating a rectangle-shaped object whose size is adjusted based on a reduction ratio, according to an embodiment of the present disclosure.

When the size of an object is adjusted according to a desired reduction ratio X (operation 100 in FIG. 1), coordinate values for an object whose size is adjusted according to the reduction ratio X are also converted according to the same ratio. That is, when the coordinate values of the top left, the bottom left, the top right, and the bottom right of the rectangle-shaped object illustrated in FIG. 3A are respectively (Left, Top), (Left, Bottom), (Right, Top), and (Right, Bottom), the coordinate values of the rectangle-shaped object whose size is adjusted according to the reduction ratio X are also converted according to the reduction ratio X, as illustrated in FIG. 3B. That is, the coordinate values of the rectangle-shaped object that is not reduced (FIG. 3A) is multiplied by (X/100), thereby being converted. In other words, the coordinate values (SLeft, STop), (SLeft, SBottom), (SRight, STop), and (SRight, SBottom) of the converted object are respectively obtained from (SLeft, STop)=(X/100)×(Left, Top), (SLeft, SBottom)=(X/100)×(Left, Bottom), (SRight, STop)=(X/100)×(Right, Top), and (SRight, SBottom)=(X/100)×(Right, Bottom). At this time, a width of the object whose size is adjusted according to the reduction ratio may be calculated by using Equation 1:

$$SW = SRight - SLeft \quad (1)$$

where SW is the width of the object whose size is adjusted according to the reduction ratio, SRight is a right horizontal coordinate value of the converted object, and SLeft is a left horizontal coordinate value of the converted object.

That is, since the object width is a horizontal length of the object, the object width may be calculated by subtracting the left horizontal coordinate value of the converted object from the right horizontal coordinate value of the converted object. Thus, the converted left horizontal coordinate value of the object and the converted right horizontal coordinate value of the object are extracted, and the extracted left horizontal coordinate value is subtracted from the extracted right horizontal coordinate value, thereby calculating the object width. However, it is understood that other methods of calculating the object width may be implemented according to other aspects of the present disclosure. For example, the right horizontal coordinate value may be subtracted from the left horizontal coordinate value.

Referring back to FIG. 1, after the object width is calculated (operation 110), it is determined whether the calculated object width is 0 in operation 120. Due to a characteristic of an integer calculation by a computer, each coordinate system indicates a position of a memory address. Therefore, coordinate values are to have integer values. Also, coordinate values (SLeft, STop), (SLeft, SBottom), (SRight, STop), and (SRight, SBottom) of the object whose size is adjusted according to the reduction ratio X are converted by multiplying (X/100) by the coordinate values of the rectangle-shaped object that is not reduced. Thus, the converted right horizontal coordinate value of the object (SRight) may be equal to the converted left horizontal coordinate value of the object (SLeft). In such a case, the object width is 0 when calculated using Equation 1. Similarly, the object width may be calculated by using Equation 2:

$$SW = (W*X)/100 \quad (2)$$

where SW is the width of the object whose size is adjusted according to the reduction ratio, W is a width of the object that is not reduced, and X is the reduction ratio.

That is, as illustrated in Equation 2, the object width may be calculated by adjusting the width of the object that is not reduced according to the reduction ratio. Accordingly, since the integer calculation by the computer does not consider decimal point values less than 1, the object width may be 0. It is understood that aspects of the present disclosure are not limited to Equations 1 and 2 to calculate the adjusted object width, and other calculations and methods may be implemented to determine the width.

If the calculated object width is 0 (operation 120), the object width is changed to a first predetermined value and set in operation 130. Here, the first predetermined value is a minimum object width on which the object may appear on a print medium. For example, the smallest integer 1 may be used as the first predetermined value. In order to change the object width to the first predetermined value and to set the changed value, a method may be implemented such that the right horizontal coordinate value of the object and/or the left horizontal coordinate value of the object are changed so that the first predetermined value is obtained by subtracting the left horizontal coordinate value of the object from the right horizontal coordinate value of the object.

After the object width has been calculated (operations 110, 120, and 130), a height of the object is calculated in operation 140. The object height that is adjusted according to the reduction ratio may be calculated by using Equation 3:

$$SH = STop - SBottom \qquad (3)$$

where SH is the height of the object whose size is adjusted according to the reduction ratio, STop is a vertical coordinate value of the top of the converted object, and SBottom is a vertical coordinate value of the bottom of the converted object.

That is, since the object height is a vertical length of the object, the object height may be calculated by subtracting the bottom vertical coordinate value of the converted object from the top vertical coordinate value of the converted object. Thus, the converted top vertical coordinate value of the object, and the converted bottom vertical coordinate value of the object are extracted, and the extracted bottom vertical coordinate value is subtracted from the extracted top vertical coordinate value, thereby calculating the object height. However, it is understood that other methods of calculating the object height may be implemented according to other aspects of the present disclosure. For example, the top vertical coordinate value may be subtracted from the bottom vertical coordinate value.

After the object height is calculated (operation 140), it is determined whether the calculated object height is 0 in operation 150. Due to a characteristic of the integer calculation by the computer, each coordinate system indicates a position of the memory address. Therefore, coordinate values are to have integer values. Also, coordinate values (SLeft, STop), (SLeft, SBottom), (SRight, STop), and (SRight, SBottom) of the object whose size is adjusted according to the reduction ratio X are converted by multiplying (X/100) by the coordinate values of the rectangle-shaped object that is not reduced. Thus, the converted top vertical coordinate value of the object (STop) may be equal to the converted bottom vertical coordinate value of the object (SBottom). In such a case, the object height is 0 when calculated using Equation 3. Similarly, the object height may be calculated by using Equation 4:

$$SH = (H*X)/100 \qquad (4)$$

where SH is the height of the object whose size is adjusted according to the reduction ratio, H is a height of the object that is not reduced, and X is the reduction ratio.

That is, as illustrated in Equation 4, the object height may be calculated by adjusting the height of the object that is not reduced to the reduction ratio. Accordingly, since the integer calculation by the computer does not consider decimal point values less than 1, the object height may be 0. It is understood that aspects of the present disclosure are not limited to Equations 3 and 4 to calculate the adjusted object height, and other calculations and methods may be implemented to determine the height.

If the calculated object height is 0 (operation 150), the object height is changed to a second predetermined value and set in operation 160. Here, the second predetermined value is a minimum object height on which the object may appear on a print medium. For example, the smallest integer 1 may be used as the second predetermined value. In order to change the object height to the second predetermined value and to set the changed value, a method may be implemented such that the top vertical coordinate value of the object and/or the bottom vertical coordinate value of the object are changed so that the second predetermined value is obtained by subtracting the top vertical coordinate value of the object from the bottom vertical coordinate value of the object.

In operation 170, raster data is generated. When the size of the object is adjusted by changing the coordinate values of the object to be printed according to the reduction ratio, and setting the changed coordinate values, the raster dater is generated based on the adjusted object.

Figure 4A:
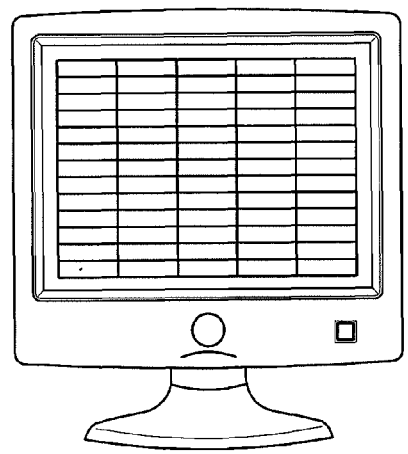
FIG. 4A is a diagram illustrating a printing target including a rectangle-shaped object.
Figure 4B:
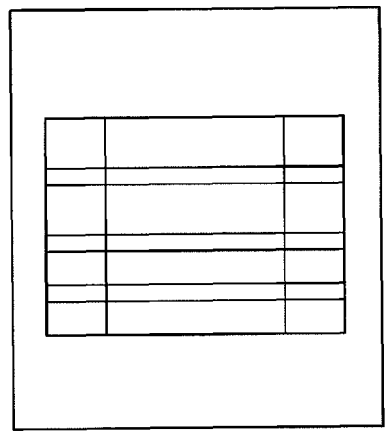
FIG. 4B is a diagram illustrating a print medium that is obtained when a conventional image forming apparatus prints a printing target, including a rectangle-shaped object, at a reduced size.

FIG. 4A is a diagram illustrating a printing target including a rectangle-shaped object, and FIG. 4B is a diagram illustrating a print medium that is obtained when a conventional image forming apparatus prints the printing target, including the rectangle-shaped object, at a reduced size. When reduction printing is performed in the conventional image forming apparatus, some objects included in the rectangle-shaped printing target (illustrated in FIG. 4A) do not appear on the print medium, according to specific coordinate values, as illustrated in FIG. 4B.

Figure 4C:
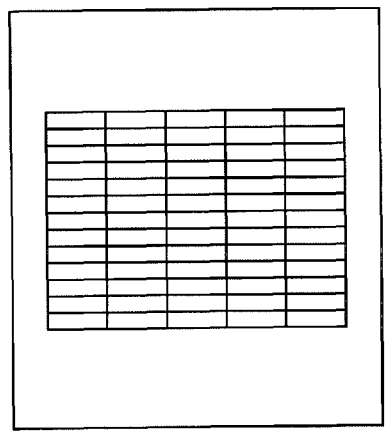
FIG. 4C is a diagram illustrating a print medium that is obtained when a printing target including a rectangle-shaped object whose size is adjusted according to an embodiment of the present disclosure is reductively printed.

FIG. 4C is a diagram illustrating a print medium that is obtained when a printing target including a rectangle-shaped object whose size is adjusted according to an embodiment of the present disclosure is printed at a reduced size. Referring to FIG. 4C, the object whose width and height are set as a minimum value appears on the print medium, and thus the object may be read from the print medium. The rectangle-shaped object is described as an example in an embodiment of the present disclosure. However, it is understood that aspects of the present disclosure are not limited thereto. For example, aspects of the present disclosure may also be applied to a line object having a thickness or a bitmap object.

Figure 5:
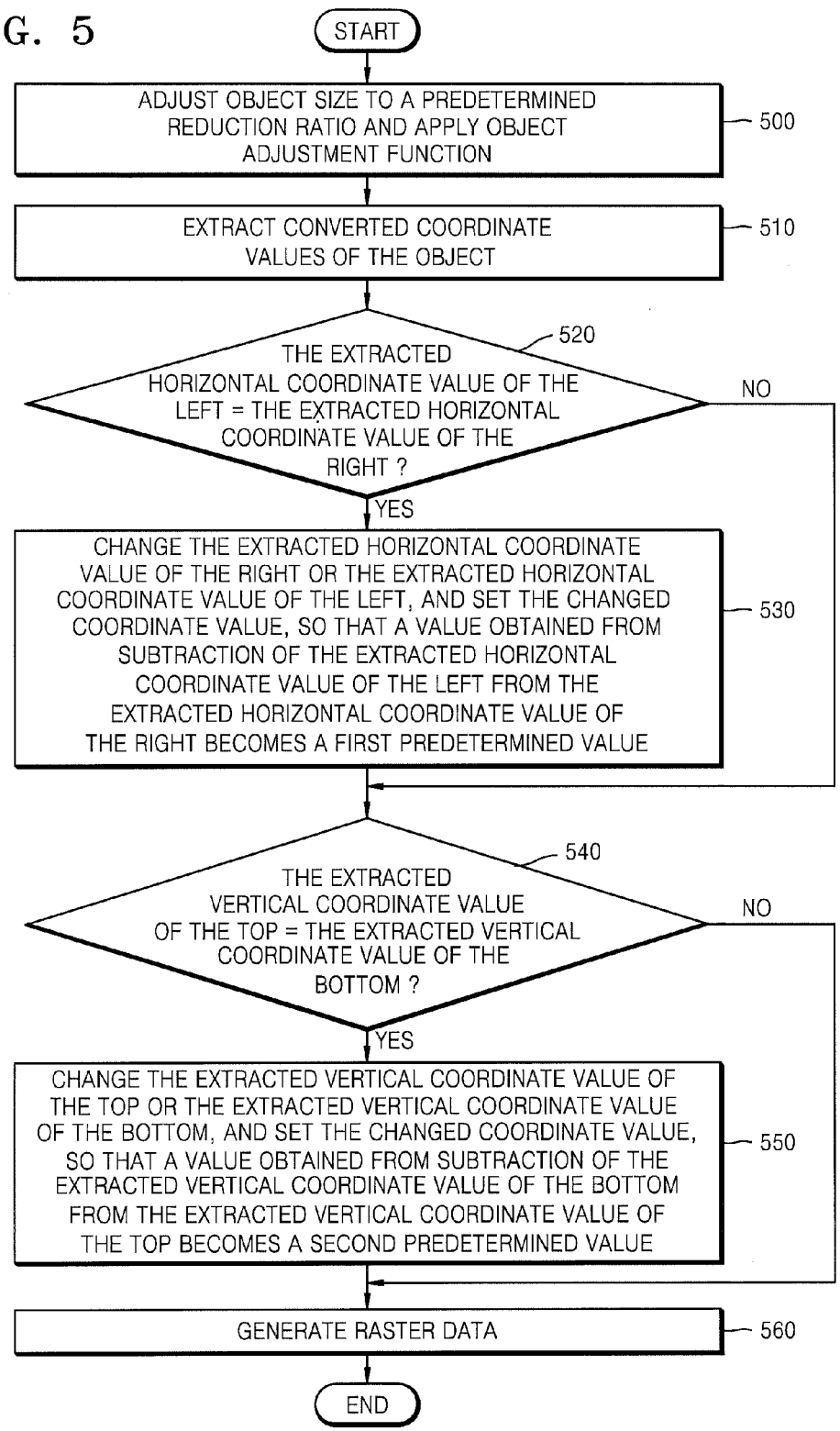
FIG. 5 is a flowchart illustrating a method of adjusting a size of an object included in a printing target to be printed based on a reduction ratio according to another embodiment of the present disclosure.

FIG. 5 is a flowchart illustrating a method of adjusting the size of an object included in a printing target to be printed based on a reduction ratio according to another embodiment of the present disclosure. Referring to FIG. 5, a size of an object is adjusted according to a reduction ratio, and an object adjustment function is applied. This operation has already been described with reference to FIG. 1 (operation 100), and therefore will not be repeated here.

After the object size has been adjusted (operation 500), converted coordinate values of the object are extracted in operation 510. Coordinate values (SLeft, STop), (SLeft, SBottom), (SRight, STop), and (SRight, SBottom) of the object whose size is adjusted according to a reduction ratio X (illustrated in FIG. 3B) are converted by multiplying (X/100) by coordinate values (Left, Top), (Left, Bottom), (Right, Top), and (Right, Bottom) of a rectangle-shaped object that is not reduced (as illustrated in FIG. 3A). Accordingly, the converted coordinate values of the object are extracted.

In operation 520, it is determined whether the extracted left horizontal coordinate value of the object and the extracted right horizontal coordinate value of the object are equal. Due to a characteristic of an integer calculation by a computer, each coordinate system indicates a position of a memory address. Therefore, coordinate values are to have integer values. Since coordinate values of the object are extracted by performing a division calculation (operation 510), the right horizontal coordinate value of the object (SRight) and the left horizontal coordinate value of the object (SLeft) are equal when decimal point values less than 1 are disregarded by the division calculation.

If the extracted left and right horizontal coordinate values are equal (operation 520), the extracted right horizontal coordinate value and/or the extracted left horizontal coordinate value are changed and set, so that a value obtained from subtraction of the extracted right horizontal coordinate value from the extracted left horizontal coordinate value is a first predetermined value. Here, the first predetermined value may be a minimum object width on Which the object may appear on a print medium. For example, the smallest integer 1 may be used as the first predetermined value.

In operation 540, it is determined whether the extracted top vertical coordinate value of the object and the extracted bottom vertical coordinate value of the object are equal. Due to the a characteristic of an integer calculation by a, each coordinate system indicates a position of a memory address. Therefore, coordinate values are to have integer values. Since coordinate values of the object are extracted by a division calculation (operation 530), the top and bottom vertical coordinate values of the object may become equal by processing decimal point values less than 1.

If the extracted top and bottom vertical coordinate values are equal (operation 540), the top vertical coordinate value and/or the bottom vertical coordinate value are changed and set, so that a value obtained from subtraction of the bottom vertical coordinate value from the top vertical coordinate value is a second predetermined value. Here, the second predetermined value may be a minimum object height on which the object may appear on a print medium. For example, the smallest integer 1 may be used as the second predetermined value.

In operation 540, raster data is generated. When the size of the object is adjusted by changing the coordinate values of the object to be printed according to a reduction ratio, and the changed coordinate values are set, the raster dater is generated based on the object whose size is adjusted.

Figure 6:
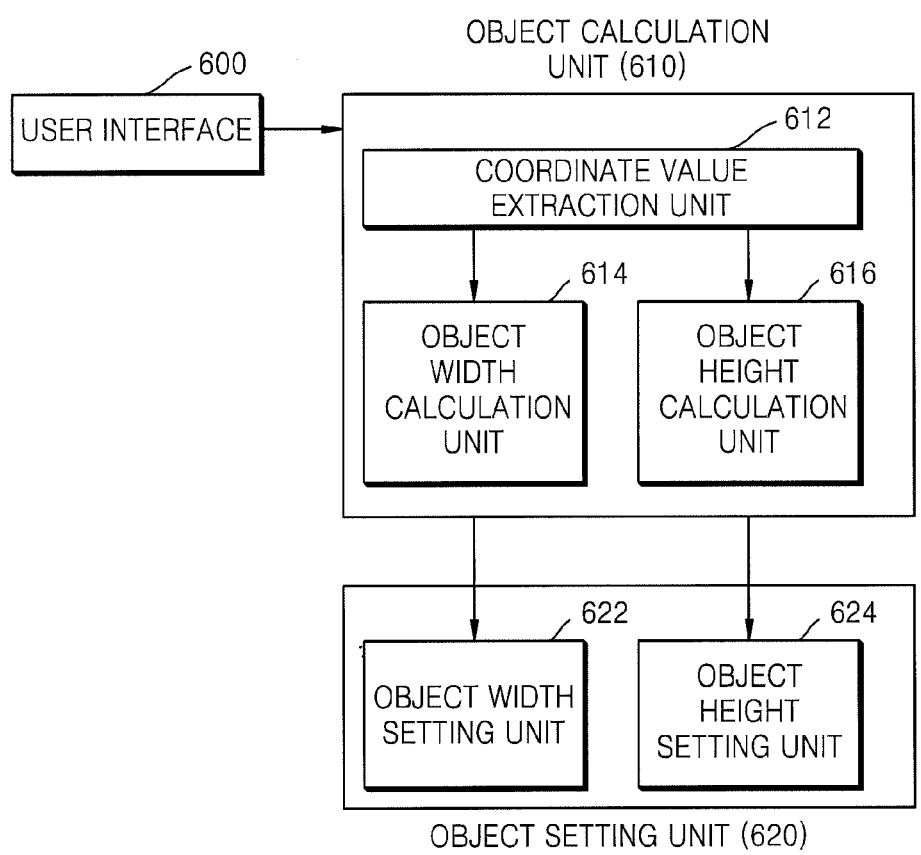
FIG. 6 is a block diagram illustrating an object adjustment apparatus adjusting a size of an object included in a printing target to be printed based on a reduction ratio according to another embodiment of the present disclosure.

FIG. 6 is a block diagram illustrating an object adjustment apparatus adjusting the size of an object included in a printing target to be printed based on a reduction ratio according to another embodiment of the present disclosure. Referring to FIG. 6, the object adjustment apparatus includes a user interface 600, an object calculation unit 610, and an object setting unit 620.

The user interface 600 is used to set a reduction ratio of the object, and to activate an adjustment function, thereby implementing an object adjustment function according to aspects of the present disclosure. The user interface 600 according to the present embodiment is illustrated in FIG. 2.

The object calculation unit 610 calculates a width and a height of an object whose size is adjusted according to the reduction ratio. The object calculation unit 610 may further include a coordinate value extraction unit 612, an object width calculation unit 614, and an object height calculation unit 616.

When an object included in a printing target is a rectangle-shaped object (as illustrated in FIG. 3A), the coordinate value extraction unit 612 multiplies (X/100) by coordinate values of an object that is not reduced, thereby extracting the coordinate values of the converted object.

The object width calculation unit 614 subtracts a left horizontal coordinate value of the object from a right horizontal coordinate value of the object, thereby calculating the object width. In particular, the object width calculation unit 614 may calculate the object width by using Equation 1 or Equation 2 above. The rectangle-shaped object is explained as an example in the present embodiment. However, it is understood that aspects of the present disclosure are not limited thereto but may also be applied to a line object having a thickness or a bitmap object. That is, in the case of the line object, since the thickness itself is transmitted as a command, the thickness itself is reduced according to a reduction ratio. In such a case, if the size of the reduced thickness is less than 1, a final thickness becomes 0 by an integer calculation. In this case, the thickness of the line object can be considered as corresponding to a width of a rectangle-shaped object.

The object height calculation unit 616 subtracts a bottom vertical coordinate value of the object from a top vertical coordinate value of the object, thereby calculating the object height. The bottom and top vertical coordinate values are extracted by the coordinate value extraction unit 612. Moreover, the object height may be calculated via the Equation 3 above.

When at least one of the calculated width and height of the object is 0, the object setting unit 620 changes the object width and/or the object height to a predetermined value, and sets the changed width and/or height. The object setting unit 620 includes an object width setting unit 622, and an object height setting unit 624.

When the object width calculated by the object width calculation unit 614 is 0, the object width setting unit 622 changes the right horizontal coordinate value of the object and/or the left horizontal coordinate value of the object, so that a value obtained from subtraction of the left horizontal coordinate value from the right horizontal coordinate value becomes a first predetermined value. Here, the first predetermined value may be a minimum object width on which the object may appear on a print medium. For example, the smallest integer 1 may be used as the first predetermined value.

When the object height calculated by the object height calculation unit 616 is 0, the object height setting unit 624 changes the top vertical coordinate value of the object and/or the bottom vertical coordinate value of the object, so that a value obtained from subtraction of the bottom vertical coordinate value from the top vertical coordinate value becomes a second predetermined value. Here, the second predetermined value may be a minimum object height on which the object may appear on a print medium. For example, the smallest integer 1 may be used as the second predetermined value.

According to the method and apparatus for adjusting the size of an object included in a printing target to be printed according to a reduction ratio, the method and apparatus calculates at least one of a width and height of the object. When at least one of the calculated width and height of the object is 0, the object width or the object height is changed to a predetermined value, and the changed value is set. By doing so, when the printing target to be printed according to the reduction ratio is printed, a phenomenon in which the object does not appear on a print medium is prevented. Also, since it is possible to read contents of the object that appears on the print medium, printing quality is increased.

The embodiments of the present disclosure can be written as computer programs and can be implemented in general-use digital computers that execute the programs using a computer-readable recording medium. In addition, a data structure used in the embodiments of the present disclosure can be written in a computer-readable recording medium through various methods and/or devices. Examples of the computer-readable recording medium include magnetic storage media (e.g., ROM, floppy disks, hard disks, etc.), and optical recording media (e.g., CD-ROMs, or DVDs).

Although a few embodiments of the present disclosure have been shown and described, it would be appreciated by those skilled in the art that changes may be made in this embodiment without departing from the principles and spirit of the invention, the scope of which is defined in the claims and their equivalents.

What is claimed is:

1. A method of adjusting a size of an object included in a printing target to be printed, by an apparatus including at least one processor, the method comprising:

calculating at least one dimensional value of the object after the size of the object has been converted according to a reduction ratio, by the way of the at least one processor; and changing the at least one dimensional value to a predetermined value, when the calculated at least one dimensional value is equal to or less than a reference dimensional value regardless of the size of the print target which includes the object, by the way of the at least one processor.

2. The method of claim 1, wherein the at least one dimensional value includes at least one of width, height and thickness.

3. The method of claim 1, wherein the calculating the at least one dimensional value of the object comprises:
calculating a width of the object as one of the at least one dimensional value, by using a left coordinate value of the object and a right coordinate value of the object.

4. The method of claim 1, wherein the calculating the at least one dimensional value of the object comprises:
calculating a height of the object as one of the at least one dimensional value, by using a top coordinate value of the object and a bottom coordinate value of the object.

5. The method of claim 1, wherein the calculating the at least one dimensional value of the object comprises:
extracting two coordinate values in opposite sides each other, from an outmost boundary of the object; and
calculating a distance between the two coordinate values as one of the at least one dimensional value.

6. The method of claim 5, changing the at least one dimensional value to the predetermined value comprises:
changing at least one of the two coordinate values of the object, thereby the distance between the two coordinate values is equal to the predetermined value, if the distance is equal to or less than the reference dimensional value.

7. The method of claim 1 further comprising:
determining whether the calculated the at least one dimensional value is equal to or less than the reference dimensional value.

8. The method of claim 1, wherein the reference dimensional value is 0.

9. The method of claim 1, wherein the predetermined value is a minimum value for which the object appears on the print medium or 1.

10. The method of claim 1, wherein the object is any one of a 2-D object, a line object having a thickness and a bitmap object.

11. A non-transitory computer readable recording medium having recorded thereon a program for executing the method of claim 1 on a computer.

12. An apparatus for adjusting a size of an object included in a printing target to be printed, the apparatus comprising:
an object calculation unit, embodied as a processor, to calculate at least one dimensional value of the object after the size of the object has been converted according to a reduction ratio; and,
an object setting unit to change the at least one dimensional value to a predetermined value regardless of the size of the print target which includes the object, when the calculated at least one dimensional value is equal to or less than a reference dimensional value.

13. The apparatus of claim 12, wherein the at least one dimensional value includes at least one of width, height and thickness.

14. The apparatus of claim 12, wherein the object calculation unit calculates a width of the object as one of the at least one dimensional value, by using a left coordinate value of the object and a right coordinate value of the object.

15. The apparatus of claim 12, wherein the object calculation unit calculates a height of the object as one of the at least one dimensional value, by using a top coordinate value of the object and a bottom coordinate value of the object.

16. The apparatus of claim 12, wherein the object calculation unit extracts two coordinate values in opposite sides each other, from outmost boundary of the object and, calculate a distance between the two coordinate values as one of the at least one dimensional value.

17. The apparatus of claim 16, wherein the object calculation unit changes at least one of the two coordinate values of the object, thereby the distance between the two coordinate values is equal to the predetermined value, if the distance is equal to or less than the reference dimensional value.

18. The apparatus of claim 12 wherein the object setting unit determines whether the calculated the at least one dimensional value is equal to or less than the reference dimensional value.

19. The apparatus of claim 12, wherein the reference dimensional value is 0 and the predetermined value is a minimum value for which the object appears on the print medium or 1.

20. The-method apparatus of claim 12, wherein the object is any one of a 2-D object, a line object having a thickness and a bitmap object.

* * * * *

UNITED STATES PATENT AND TRADEMARK OFFICE
CERTIFICATE OF CORRECTION

| | | |
|---|---|---|
| PATENT NO. | : 8,958,118 B2 | Page 1 of 1 |
| APPLICATION NO. | : 13/483320 | |
| DATED | : February 17, 2015 | |
| INVENTOR(S) | : Sung-Myun Lee | |

It is certified that error appears in the above-identified patent and that said Letters Patent is hereby corrected as shown below:

Title page

Item (57) Abstract, Line 7-8

Delete "the calculated the" and insert --the calculated--, therefor.

Claims

Claim 5, Column 9, Line 26

After "sides" insert --of--.

Claim 7, Column 9, Line 37

Delete "the calculated the" and insert --the calculated--, therefor.

Claim 16, Column 10, Line 27

After "sides" insert --of--.

Claim 18, Column 10, Line 37

Delete "the calculated the" and insert --the calculated--, therefor.

Claim 20, Column 10, Line 44

After "The" delete "-method".

Signed and Sealed this
Thirteenth Day of October, 2015

Michelle K. Lee
*Director of the United States Patent and Trademark Office*